United States Patent [19]

Powers et al.

[11] Patent Number: 4,797,992

[45] Date of Patent: Jan. 17, 1989

[54] METHOD OF MAKING A THIN FILM INTEGRATED MICROCIRCUIT

[75] Inventors: Vernon B. Powers; Deborah C. Murphy, both of W. Melborne, Fla.

[73] Assignee: Hercules Defense Electronics Systems Inc., Clearwater, Fla.

[21] Appl. No.: 137,997

[22] Filed: Dec. 28, 1987

Related U.S. Application Data

[62] Division of Ser. No. 9,864, Feb. 2, 1987, Pat. No. 4,740,762.

[51] Int. Cl.$^4$ .......................................... H01P 11/00
[52] U.S. Cl. ..................................... 29/600; 333/1.1; 156/89
[58] Field of Search .................... 29/600; 156/89, 294; 333/1.1, 24.1, 24.2; 361/401

[56] References Cited

U.S. PATENT DOCUMENTS

| | | | |
|---|---|---|---|
| 3,456,213 | 7/1969 | Hershenov | 333/1.1 |
| 3,480,836 | 11/1969 | Aronstein | 361/401 X |
| 4,356,047 | 10/1982 | Gordon et al. | 156/89 |
| 4,415,871 | 11/1983 | Stern et al. | 333/1.1 |
| 4,529,459 | 6/1985 | Ebata et al. | 156/89 |
| 4,678,683 | 7/1987 | Pasco et al. | 156/89 X |
| 4,681,656 | 7/1987 | Byrum | 156/89 X |
| 4,704,588 | 11/1987 | Kane | 333/1.1 |
| 4,740,762 | 4/1988 | Powers et al. | 333/1.1 |

Primary Examiner—P. W. Echols
Assistant Examiner—Taylor J. Ross
Attorney, Agent, or Firm—Seymour Levine; Michael B. Keehan; Edmund C. Ross, Jr.

[57] ABSTRACT

A method of forming a microwave integrated circuit is disclosed. A hole is bored in an alumina substrate and a plug having a diameter substantially equal to the hole is provided. The hole and the perimeter of the plug are coated with a thermally fusable dielectric composition and the plug is embedded in the hole. Heating the substrate fuses the plug is place and crystalizes the composition into a glass with compatible thermal expansion. At least one face of the substrate and plug are then polished to provide a planar surface. The metalized circuit is then formed on this assembly, which minimizes conductive tracking on the substrate and facilitates alignment of the circuit with the plug.

9 Claims, 2 Drawing Sheets

METHOD OF MAKING A THIN FILM INTEGRATED MICROCIRCUIT

This is a divisional of co-pending application Ser. No. 009,864 filed on Feb. 2, 1987, now U.S. Pat. No. 4,740,762.

BACKGROUND OF THE INVENTION

1. Field of the Invention

The present invention relates generally to microwave circuits and to circuits utilizing ferrite junction technology, and more particularly to a method of embedding ferrite devices in alumina substrates.

2. Description of the Prior Art

Microwave integrated circuits have been used to produce oscillators, mixers, modulators, and circulators and other devices constructed by combinations of microstrip lines and ferrite disc elements embedded in a non-conductive substrate. For thin film microcircuits, a precise machining technique is required to reduce high frequency losses. One form of the prior art consists of a ferrite disc embedded in a dielectric substrate. The substrate preferably may be comprised of alumina (aluminum oxide, $Cl_2O_3$). Reflection and thermal losses of the connections depend primarily on the dimensional precision. Dimensional imperfections, such as the gap between the ferrite disc and hole in the substrate, the roughness of the sidewall, and the roundness of the disc have been found to cause excessive insertion losses.

One such device is described by Ogawa, et al., A 26-GHz Band Integrated Circuit of a Double-Balanced Mixer and Circulators, Trans IEEE MTT, Vol. MTT-30, No. 1, January 1982. The fabrication process described therein called for preparing a tapered ferrite disc, metalizing the top and bottom surfaces with a gold layer, and embedding by a force fit in a laser drilled, diamond polished tapered hole in the substrate. One disadvantage of this process was that the substrate and ferrite thickness must be at least 0.012 inches or greater, lowering the realizable frequency of operation. Further, it is difficult to obtain a perfect fit between the tapered ferrite disc and substrate hole, particularly with temperature variations. Any variation in the angle of the taper between the hole and the ferrite disc will be observed as an electrical loss. If the hole is not large enough, the pressure used during the embedding process can crack either the ferrite or the substrate; if the hole is too large, there will be a discontinuity caused by the gap between the substrate and ferrite. Further, the temperature coefficient of expansion (TCE) mismatch between the ferrite and substrate can result in microscopic cracks and decreased electrical performance over temperature variations. Moreover, where the holes are laser drilled after metalization and etching, the vaporized metal may produce conductive tracks through the hole. Thus, an additional step of reaming the holes by conventional means is required to clear electrical short circuits.

The present invention provides a method of bonding the ferrite disc to a dielectric substrate that permits relatively large gaps between the ferrite and sidewalls of the substrate but results in very small electrical losses. A bonding composition which matches the temperature coefficients of expansion between the substrate and the ferrite as well as dielectric constant differences is applied to fill in the gaps. The process allows the ferrite to be metalized after embedding, thereby avoiding the problem of vaporized metal tracks in the substrate.

SUMMARY OF THE INVENTION

A microwave circuit embodying the principles of the present invention is constructed by boring a hole in a planar substrate of insulating material, such as alumina, preparing a planar disc of magnetically permeable material such as ferrite whose dimensions match that of the hole in the substrate, embedding the disc in the hole after coating the hole and the circumference of the disc with a fusable dielectric composition of glass and alumina, such that when heated to a suitable temperature the composition crystalizes and fuses the disc to the substrate. The face of the substrate is then polished and metalized, defining the desired circuit pattern. A completed product thereby comprises a ferrite plug bonded to the hole in an alumina substrate by means of a glass composition filling any gaps therebetween and a metalized conductive pattern for applying energy to and extracting energy from the ferrite plug.

DESCRIPTION OF THE PREFERRED EMBODIMENT

Figure 1:
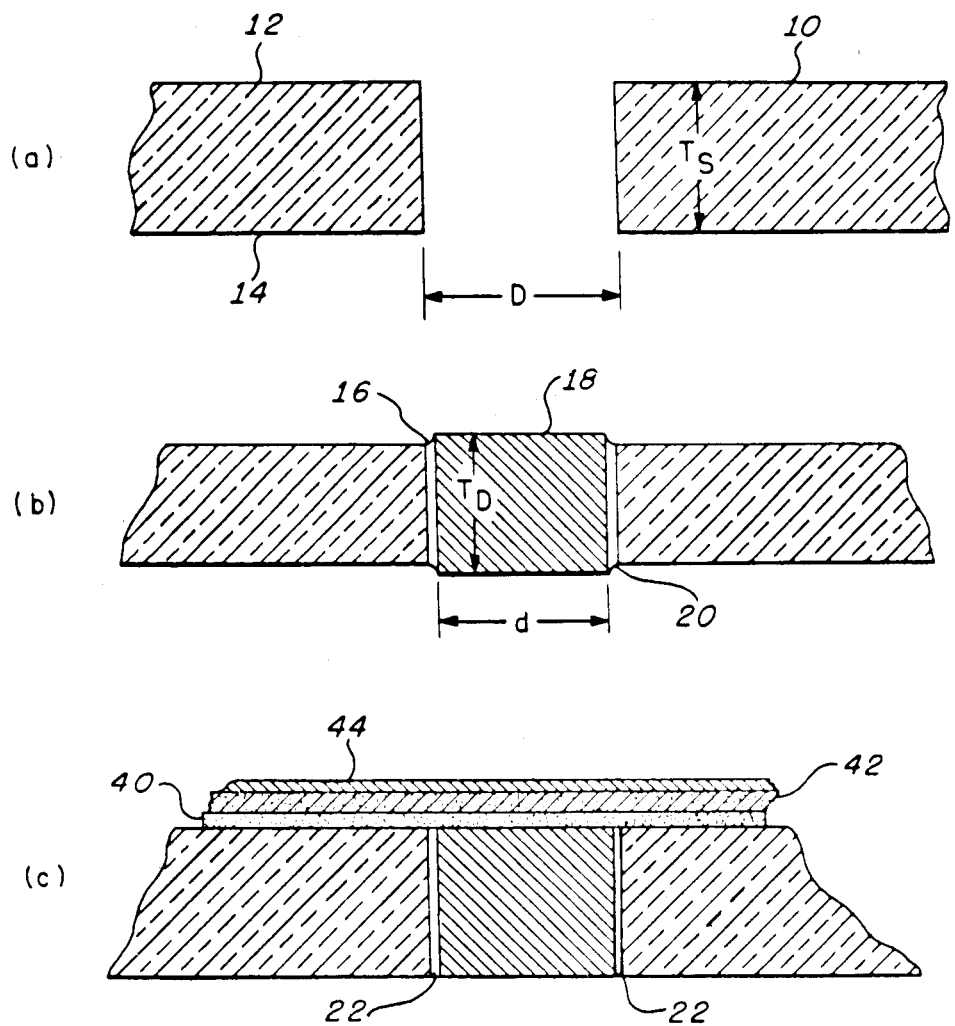
FIGS. 1a-1c are cross sectional views in elevation showing steps in the fabrication of the present invention.
Figure 2:
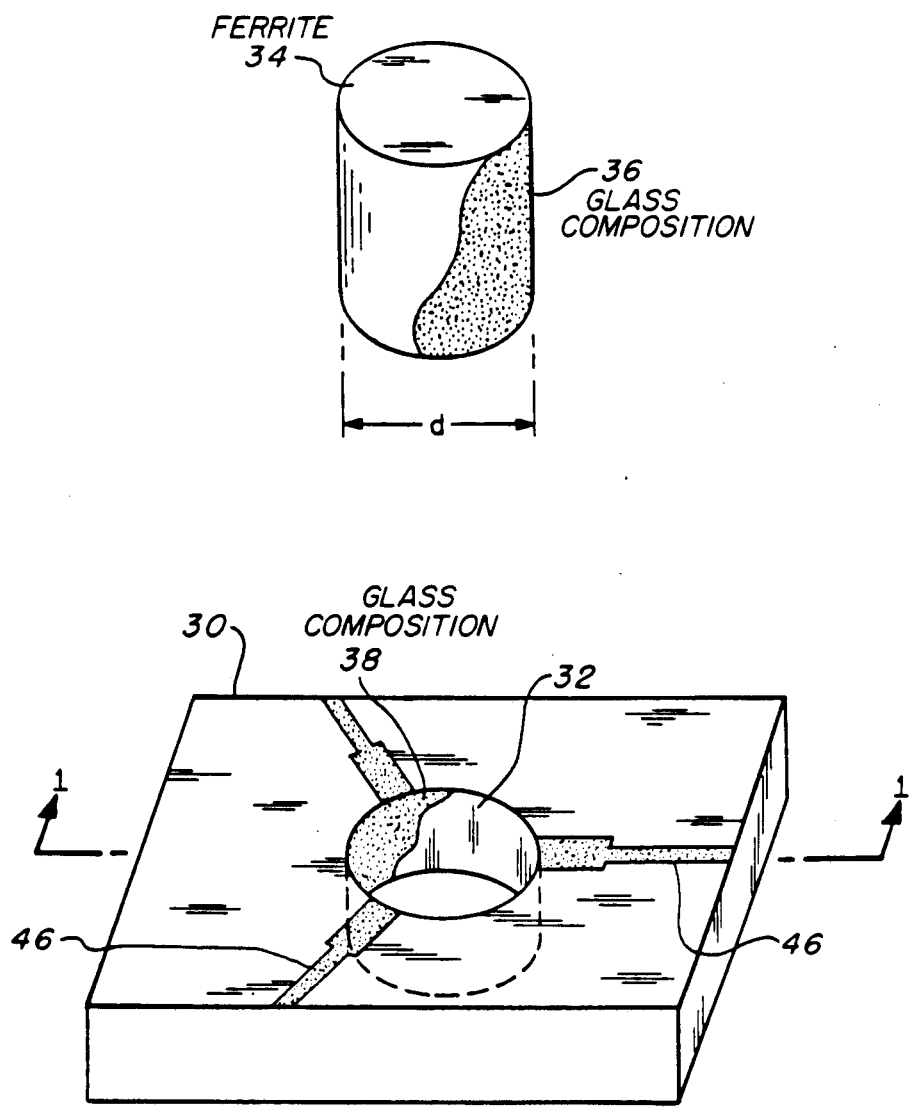
FIG. 2 is an isometric drawing of the components and interrelation thereof.

Referring to FIG. 1, a sectional view is shown of the various steps in fabrication of the microwave circuit, taken through the line 1—1 of FIG. 2. A substrate 10, which may be comprised of alumina has a thickness $T_S$ of the order of 0.01 inch and an aperture therethrough, which may be comprised of a hole having a diameter D, for example 0.05 inch. At least one surface 12 of the substrate 10 is polished to a surface flatness typically 2 microinch. The opposing side 14 may have a surface finish as great as 15 microinch. A suitable material for the substrate is SUPERSTRAIGHT$_R$ 996, comprised of 99.6 alumina, as supplied by Materials Research Corporation, Orangeburg, New York 10962. The hole D is drilled by a laser beam to a tolerance of +0.0005, −0.0000 inch of the ferrite diameter. Laser drilling, while not necessarily providing straighter side walls than machine drilling, permits tighter tolerance to be maintained and reduces the possibility of microcracks in the substrate. The hole is preferably drilled into the polished side 12 of the substrate. While for convenience in fabrication a circular hole is shown in the figure, a rectangular slot or other geometric shape may be provided by the same process, so long as the circumferential dimensions of the hole are matched to the ferrite disc.

A ferrite disc 18 is fabricated and embedded in the substrate in the following manner. The ferrite disc may be produced from a ferrite substrate having a thickness $T_D$ of +0.002, −0.000 inch compared to the substrate thickness $T_S$. A laser is also used to cut the ferrite disc from the ferrite substrate. The nominal ferrite disc diameter d is equal to the hole diameter D. One or more ferrite discs are piled on a rotating jig rod and cylindrically ground by a diamond abrasive wheel, then washed, as described in detail in the above paper by Ogawa, which is incorporated herein by reference. While a ferrite disc is preferred, other magnetically - permeable materials may also be suitable. The disc 18 is inserted in the bore D of substrate 10, the difference in the diameters D and d, respectively, providing a gap 16 between the members. To fill the gap, a glass composite 20 is applied to the periphery of the disc and the hole in the substrate. A suitable composition is comprised of lead-zinc borate glass with a small amount of silica and aluminum oxide, available as part number 6214 from Solitron Devices, Ft. Lauderdale, Florida. The glass composition is used to provide physical and electrical matching of the disc 18 and substrate 10. Thus, for the device to work at high temperatures without physical damage and electrical performance degradation, the TCE mismatch between the ferrite and substrate must be maintained. Typically values for alumina are $6.4 \times 10^{-6}$ in/in/degree C.; for ferrite $11.3 \times 10^{-6}$ in/in/°C.; and for the glass composition $8.0 \times 10^{-6}$ in/in/°C. The glass composition, with a TCE between that of the substrate and the ferrite, will efficiently absorb stress in the interface at high temperatures.

The impedance of a microwave stripline is determined by the width of the line, the thickness of the substrate material, and the dielectric constant of the substrate material. It is important that the dielectric constant of the glass composition be of the same order of magnitude as that of the ferrite and substrate, in order to provide a satisfactory impedance match. This will minimize losses due to reflection at the interface. For alumina having a dielectric constant of 9.6 and ferrite having a dielectric constant of 15, the glass composition should have a dielectric constant in the range of 10. By providing a ferrite disc of thickness slightly greater than the substrate and filling the gap with the glass composition, the surface may be polished to a finish or 2 microinch or better. A flat surface allows for substantially perfect alignment of the metalizing mask over the ferrite and continuous circuitry over the interface free from interconnecting steps. This structure will eliminate reflection losses commonly experienced by the need to bond metallically the ferrite to the substrate due to surface flatness tolerances. Further, without a step to cause interference, the photomask can be perfectly aligned with the ferrites on the substrate, thereby reducing the possibility of losses caused by having circuitry deposited over the interface onto the substrate.

Referring again to FIG. 1, following coating of the components with the glass composition and embedding of the ferrite disc in the substrate, the assembly is subjected to a mild vacuum ($10^{-3}$ Torr) to evacuate any air in the gap. The substrate is then dried for 10-15 minutes at 100° C., and fired for 2 hours at 380° C.±10° C. in vacuum. This step will fuse the glass composition to the substrate and the disc forming an integral interface 22. Since the ferrite disc preferably is of a slightly greater thickness than the substrate, and glass miniscus is formed at the gap 16, it is necessary following the firing to lap the surface 12 and 14 of the assembly. The ferrite-glass compostition interface on both sides of the substrate is polished until it is flush with the substrate. Coarse polishing is accomplished using 0.3 um diamond abrasive paste in an ultrasonic abrasive unit. The substrate is then finally polished, manually, using 0.05 um abrasive paste. The desired surface finish across the surface interface is less than 2 microinches on the polished side 12, and less than 15 microinches on the reverse side 14. The surface condition may be measured with any suitable device, such as an optical flat, laser interferometer, or profilometer. One suitable device is the Dektak IIA, as manufactured by Sloan Technology Corporation, Santa Barbara, Calif. 03103.

Following surface polishing, the interface 22 is inspected for voids. Preferably, any void greater than about 1/20 of the ferrite thickness $T_D$ is again filled with glass composition, dried, fired and polished as described above. The substrate is then cleaned with isopropyl alcohol ($C_3H_8O$) by submersion, undiluted by additional solvents, avoiding ultrasonic treatment. A further vacuum baking for 15 minutes at 100° C. is useful to remove residual solvents in preparation for metalizing.

Referring now to FIG. 2, the alumina substrate 30 is prepared with a hole 32 and coated on the interior of the hole with glass composition 38. A ferrite disc 34, having a diameter d suitable for precise fitting in the hole 32, is coated on the mating surface with the glass composition 36. The disc is inserted into the hole and the excess composition removed.

Figure 3:
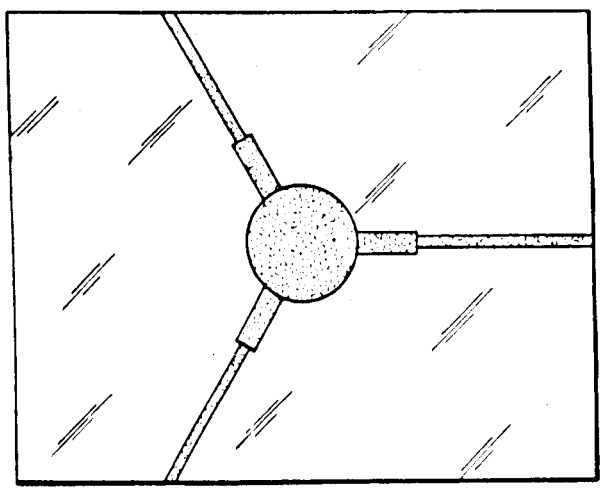
FIG. 3 is a plan view of a completed thin film microcircuit device of the present invention.

After fusing of the ferrite 34 to the substrate 30, metalized electrodes 46 will be deposited in a pattern over selected regions of the substrate 30 and disc 34 to provide the necessary conductive path for furnishing or extracting energy from the assembly. Referring again to FIG. 1c, a thin layer 40 (approximately 200 A°) of chr a thin layer 40 (approximately 200 Å) of chromium or nickel chromium is sputtered or vacuum deposited on the substrate. This is followed by sputter depositing or vacuum depositing about 2000 Å of gold 42 over the chromium. Finally, the gold thickness is increased by electroplating 200 microinches of gold 44. Both sides of the substrate are plated in this manner, the reverse side of the substrate defining a ground plane. The circuit is then photo-etched on the highly polished side in a conventional manner to generate the microstrip conductors of the desired shape and dimensions. Alignment of the pattern onto the ferrite is critical to assure that there is no overlap of the metalization on the substrate surface. FIG. 3 shows in plan view a completed ferrite device.

It may be seen from the foregoing that the present invention has the following advantages:
  A. Conventional materials and processes are used.
  B. There are no discontinuities or steps in the metalization, resulting in low loss circuits.
  C. Wider tolerances are permissible due to the ferrites not being tooled to each individual hole or cavity.
  D. Metalizing after ferrite insertion and polishing avoids the risk of vaporizing metal tracks in the substrate holes.
  E. Avoidance of a force fit reduces mechanical fracture.
  F. The glass composition provides a thermal match between ferrite disc and substrate which allows wide temperature excursions without impairment of performance.

While the invention has been described in its preferred embodiment, it is to be understood that the words which have been used are words of description rather than limitation and that changes may be made within the purview of the appended claimes without departing from the true scope and spirit of the invention in its broader aspects.

We claim:
1. A method of fabricating a microwave integrated circuit comprising the steps of:
   providing a planar substrate of insulating material,
   boring a hole of predetermined diameter in said substrate, providing a planar disc of magnetically permeable material having a diameter substantially equal to said predetermined diameter and a circumferential perimeter, coating said hole and said perimeter of said disc with a thermally fusable dielectric composition, embedding said disc in said hole, heating said substrate to a predetermined temperature for a time period sufficient to crystalize said composition and fuse said disc to said substrate, polishing at least one face of said substrate and said disc to provide a planar surface, and metalizing and selectively patterning said disc in regions of said face with a conductive material.

2. The method as set forth in claim 1, wherein said substrate is comprised of aluminum oxide.

3. The method as set forth in claim 2, wherein said magnetically permeable material comprises iron ferrite.

4. The method as set forth in claim 3, wherein said dielectric composition is comprised of lead-zinc borate glass, silica, and aluminum oxide.

5. The method as set forth in claim 4, wherein said predetermined temperature is 380° C. and said time period is at least 2 hours.

6. The method as set forth in claim 5, wherein said substrate, said disc, and said composition are comprised by a substantially equal predetermined temperature coefficient of expansion.

7. The method as set forth in claim 6, wherein said substrate, said disc, and said composition are comprised of a substantially equal predetermined dielectric constant.

8. The method as set forth in claim 7, wherein said temperature coefficient of expansion has a value between $6 \times 10^{-6}$ and $12 \times 10^{-6}$ in/in/°C.

9. The method as set forth in claim 8, wherein said dielectric constant has a value between 9 and 15.

* * * * *